(12) United States Patent
Choi et al.

(10) Patent No.: US 6,586,804 B2
(45) Date of Patent: Jul. 1, 2003

(54) SHALLOW TRENCH ISOLATION TYPE SEMICONDUCTOR DEVICE AND METHOD OF MANUFACTURING THE SAME

(75) Inventors: Jung-Dal Choi, Suwon (KR); Kyu-Charn Park, Pyeongtaek (KR); Dong-Seog Eun, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/949,110

(22) Filed: Sep. 7, 2001

(65) Prior Publication Data

US 2002/0033516 A1 Mar. 21, 2002

(30) Foreign Application Priority Data

Sep. 21, 2000 (KR) .......................................... 2000-55509

(51) Int. Cl.$^7$ .............................................. H01L 29/78
(52) U.S. Cl. ...................... 257/374; 257/350; 257/501; 257/514; 257/519
(58) Field of Search ................................. 257/501, 513, 257/514, 519, 350, 374

(56) References Cited

U.S. PATENT DOCUMENTS 5,473,186 A * 12/1995 Morita ........................ 257/519
5,789,792 A * 8/1998 Tsutsumi ..................... 257/506

* cited by examiner

*Primary Examiner*—Jerome Jackson
(74) *Attorney, Agent, or Firm*—Mills & Onello, LLP

(57) ABSTRACT

A shallow trench isolation type semiconductor device includes a gate insulating layer formed in a first region and in a second region. The gate insulating layer is of greater thickness in the first region, relative to the thickness of the gate insulating layer in the second region. A shallow trench isolation layer is also formed in the first region and the second region, the shallow trench isolation layer in the first region being thinner than shallow trench isolation layer in the second region.

6 Claims, 9 Drawing Sheets

US 6,586,804 B2

SHALLOW TRENCH ISOLATION TYPE SEMICONDUCTOR DEVICE AND METHOD OF MANUFACTURING THE SAME

This application relies for priority upon Korean Patent Application No. 2000-55509, filed on Sep. 21, 2000, the contents of which are herein incorporated by reference in their entirety.

FIELD OF THE INVENTION

The present invention relates to a semiconductor device and, more particularly, to a shallow trench isolation type semiconductor device and a method of manufacturing the same.

BACKGROUND OF THE INVENTION

Shallow trench isolation (STI) is commonly used to achieve device isolation in a manner so as to avoid the occurrence of a phenomenon referred to in the art as a "bird's beak" phenomenon. For tight device isolation, the trench should be increased in length and width. As the integration level of semiconductor devices increases, the trench necessarily must decrease in width; which in turn, forces the trench to increase in depth to achieve proper isolation. Unfortunately, it is difficult for the trench depth to keep up with the trench width, as filling of the narrow and deep trenches is increasingly challenging.

Although operating a semiconductor device at a single voltage may be convenient, in some cases a high voltage may be applied to a portion of device in order to realize functions of a memory device such as EEPROM or flash memory. Since the portion of the device receiving the high voltage must have a voltage-resistant structure, a gate insulating layer in the high voltage region is relatively thicker, as compared to other regions.

FIG. 1 exemplarily illustrates a self-aligned flash memory device in which a polysilicon layer to compose a floating gate is partially formed prior to formation of a trench. In a cell area, an N-type well 105 and a P-type well 107 are formed on a P-type semiconductor substrate 110 to form a cell transistor. In a high voltage area, the transistor is formed in the P-type semiconductor substrate 110 for the purpose of forming a high junction resistor to a high voltage. To achieve tight device isolation, an ion implantation layer 109 for a channel stop is formed at a trench-formation region prior to formation of the trench. Preferably, a lower step of the trench is positioned to maximize ion concentration of the ion implantation layer 109. Gate insulating layers 120 and 121 are formed, and a polysilicon layer 130 is formed thereon. An etch protection layer 140, for trench etching, and a hard mask layer 145 are sequentially formed, for example silicon nitride and silicon oxide, respectively.

In the step of etching the trench area, as shown in FIG. 2, the hard mask layer 145, the etch protection layer 140, and the polysilicon layer 130 are sequentially etched. When the gate insulating layers 120 and 121 are then etched, the gate insulating layer 121 in the cell area becomes completely etched while the gate insulating layer 120 in the high voltage area remains to a thickness of 100 Å–300 Å due to the relative difference in thickness of the gate insulating layers 120, 121 of the respective regions. If the trench is etched by targeting silicon of the substrate 100, the remaining gate insulating layer 120 operates as a mask. Thus, a trench is not formed, or is formed to be thinner than required, so that insulation provided by that trench may be poor.

In this regard, there is provided an applicable method wherein after removing the gate-insulating layer 121, a photoresist pattern 150 is formed to protect the cell area, and the remaining gate insulating layer 120 is removed by means of a silicon oxide etchant. If the etching is carried out without the photoresist pattern 150 by means of the silicon oxide etchant, the exposed gate insulating layer 120 is attacked around the trench in the cell area. This results in functional deterioration of the cell transistor. The gate insulating layers in the cell area and the high voltage area are thus removed by means of the etching, as shown in FIG. 3, in spite of the thickness difference.

Referring to FIG. 4, the substrate 110 in the trench area is etched by silicon etchant. An oxide layer for device isolation is stacked on the trench. By means of chemical mechanical polishing (CMP), the oxide layer is then removed to form a device isolation layer 155. For the tight insulation for high voltage operation, a trench width is preferably high and transistor concentration is preferably low.

Since the trench width is high and the transistor density is low in order to achieve tight insulation for high voltage operation, the trench depth is to be high during the step of etching a channel. In other words, an exposure step is additionally required for protecting the cell area and removing the remaining gate insulating layer of the high voltage area, and the trench etching speed is high. Therefore, a channel stop ion implantation layer 109 is almost removed, and therefore device isolation is weakened.

SUMMARY OF THE INVENTION

It is an object of the present invention to provide a shallow trench isolation (STI) type semiconductor device and method of forming such a device. which can simplify processing steps and achieve a tight device isolation in both a cell area and a high voltage area.

In one aspect, the present invention is directed to a shallow trench isolation type semiconductor device. A gate insulating layer is formed in a first region, for example a high-voltage region, and in a second region, for example a low-voltage region, the gate insulating layer being of greater thickness in the first region, relative to the thickness of the gate insulating layer in the second region. A shallow trench isolation layer is formed in the first region and the second region. The shallow trench isolation layer in the first region is thinner than shallow trench isolation layer in the second region.

The shallow trench isolation area in the first region is preferably thinner than that in the second region by approximately 100 Å–900 Å. An ion implantation layer for channel stop is preferably formed to overlap with a lower part of the shallow trench isolation layer, the depth of the ion implantation layer being identical in both the first region and the second region. The ion implantation layer is preferably a P-type impurity implantation layer. The gate insulating layer in the first region preferably has a thickness of 200 Å–400 Å, and the gate insulating layer in the second region preferably has a thickness of 70 Å–100 Å.

In another aspect, the present invention is directed to a shallow trench isolation type semiconductor device including gate insulating layers formed in a cell area and a high voltage area, the gate insulating layers being different in thickness in the cell area and high voltage area. A shallow trench isolation layer is formed in the cell area and the high voltage area, wherein the shallow trench isolation layer in the high voltage area is thinner than that of the cell area by 100 Å–900 Å. An ion implantation layer for channel stop overlaps with a lower part of the shallow trench isolation layer, wherein the combined depth of the ion implantation layer and the shallow trench isolation layer is equal in the cell area and the high voltage area.

In another aspect, the present invention is directed to a method of manufacturing a shallow trench isolation type semiconductor device. A gate insulating layer is formed in a first region and in a second region of a silicon substrate, the gate insulating layer being greater in thickness in the first region, as compared to the thickness in the second region. An etch protection layer is provided on the gate insulating layer. An etching mask pattern is formed to expose first and second trench regions, and the etch protection layer is masked using the etching mask pattern. The gate insulating layer is etched until the gate insulating layer in the second region is completely removed. The remaining gate insulating layer in the first region is then removed using an etchant wherein an etching selectivity of the substrate to the gate insulating layer is in the range of 1:1 to 3:1, to exposing the silicon substrate. The exposed silicon substrate is then etched in the first region for a predetermined time to form a trench for device isolation.

Preferably, first and second ion implantation layers for channel stop are formed through ion implantation prior to formation of the gate insulating layers on the substrate in the first and second regions, wherein the lower part of the trench is positioned in the body of a second ion implantation layer in the second region, and on a body of a first ion implantation layer in the first region.

Optionally, gate insulating layers of different thickness are formed in the second region and the first region, and a conductive layer is provided on the entire surface of the substrate prior to providing the etch protection layer.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
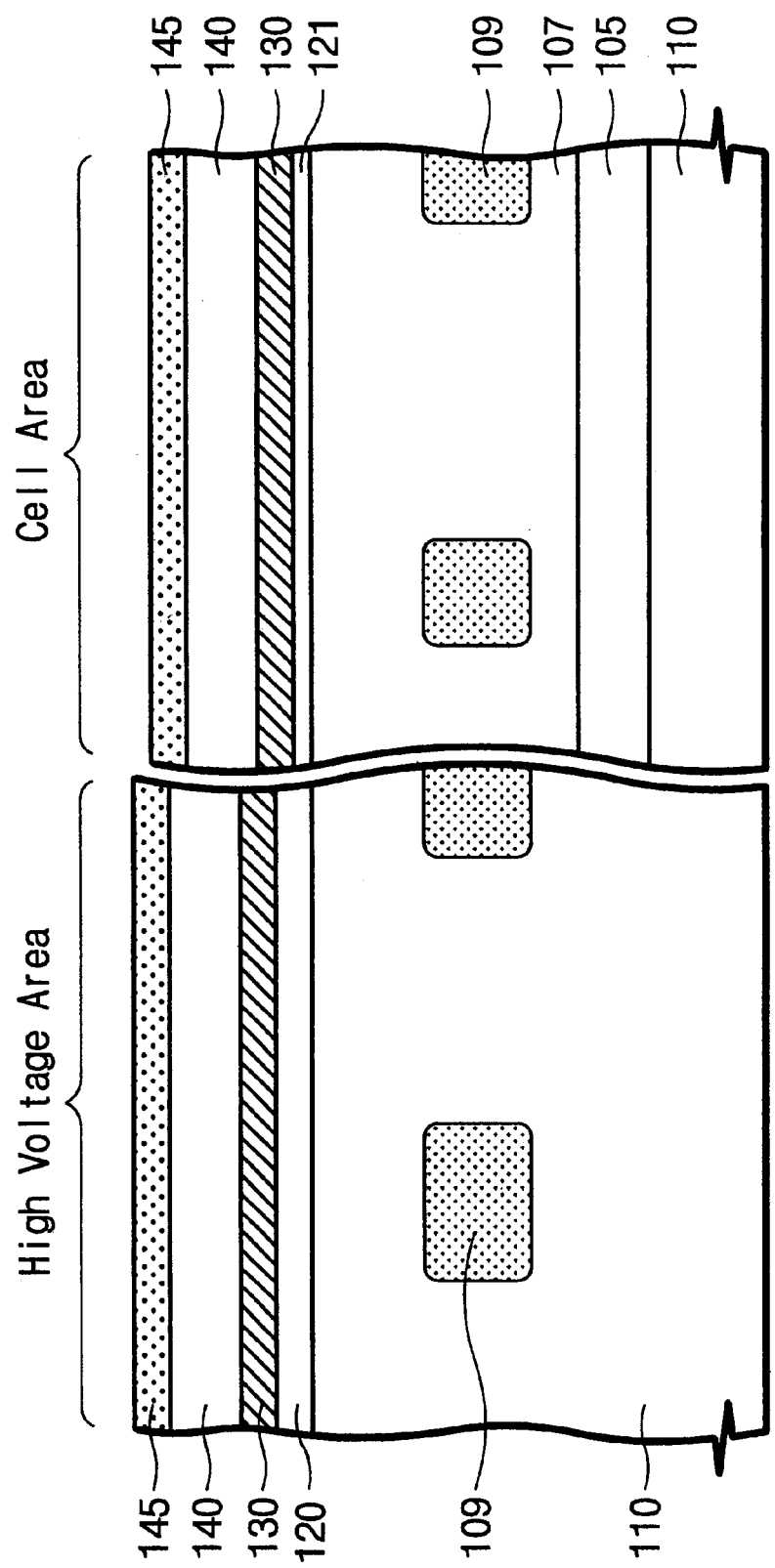
FIG. 1 through FIG. 4 are cross-sectional views of the conventional process flow showing the steps of achieving a shallow trench isolation with gate insulating layers of a different thickness in a cell area and a high voltage area of a flash memory.
Figure 2:
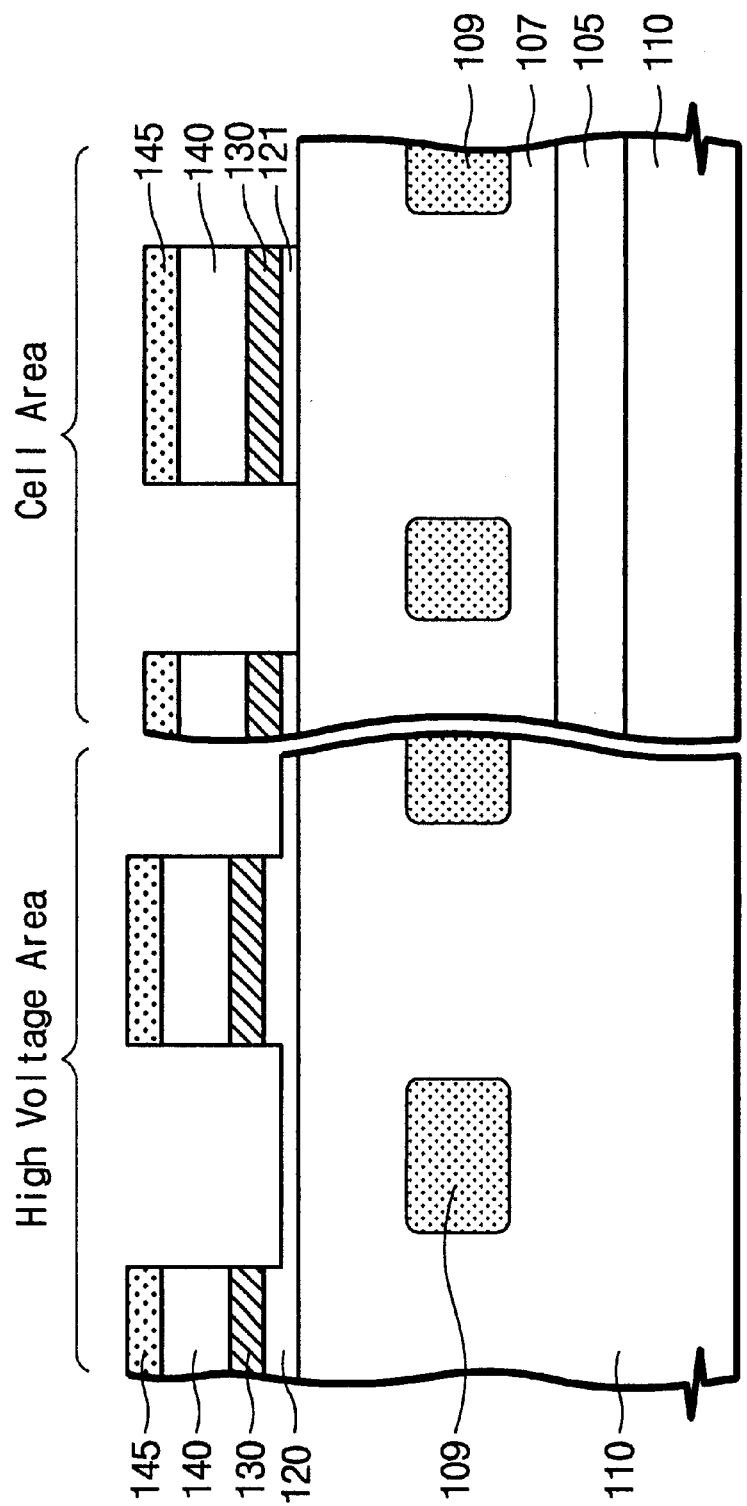
Figure 3:
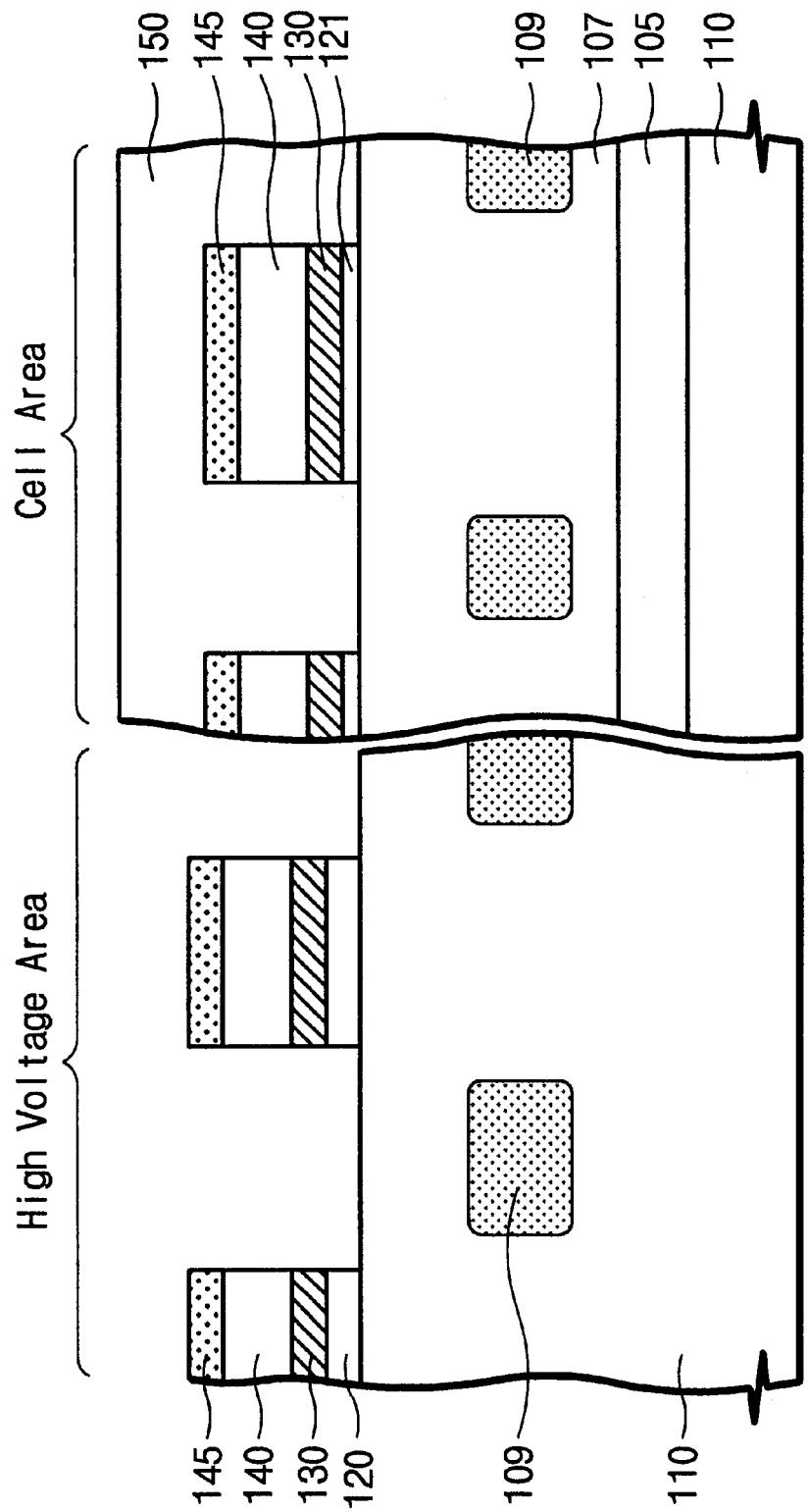
Figure 4:
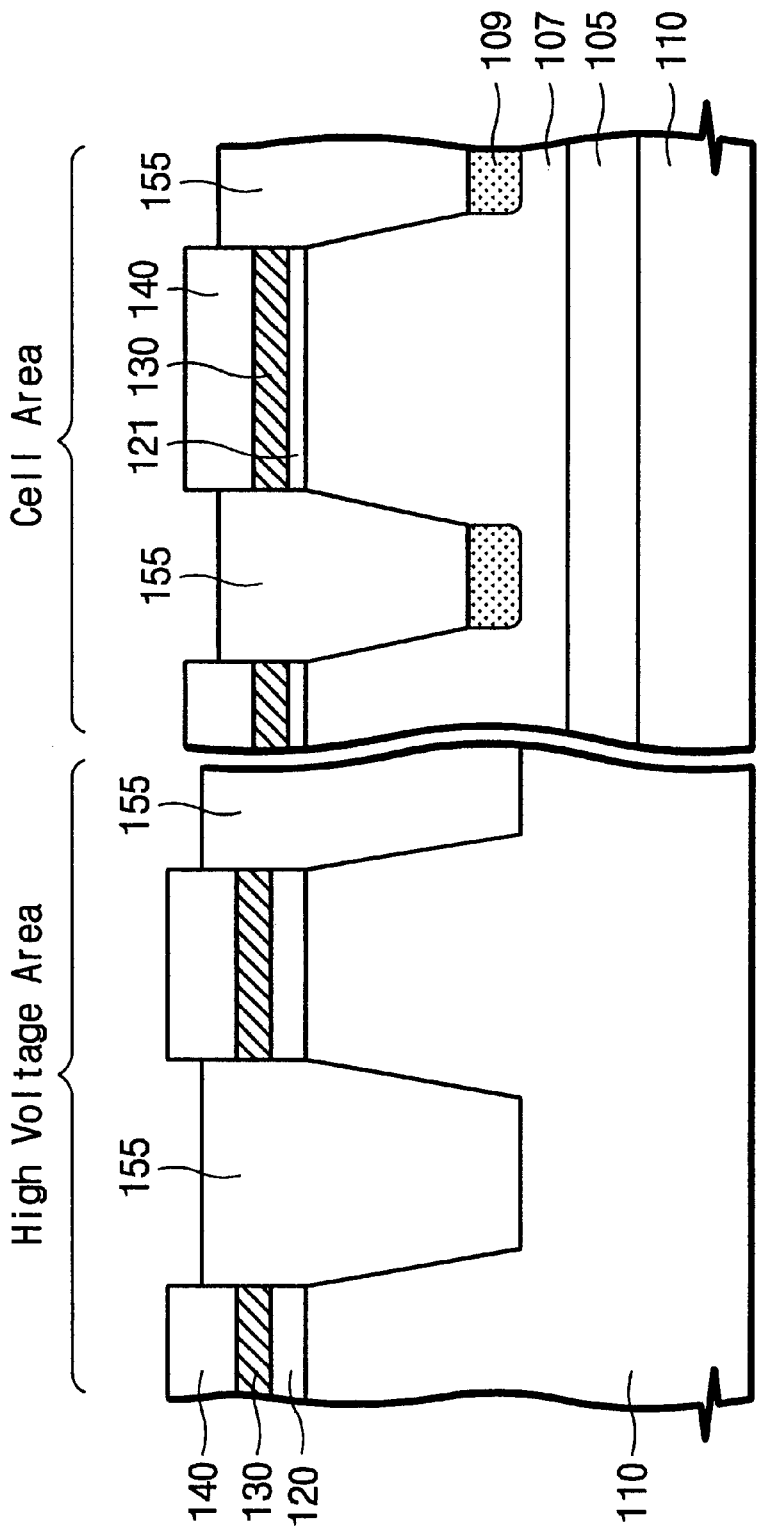
Figure 5:
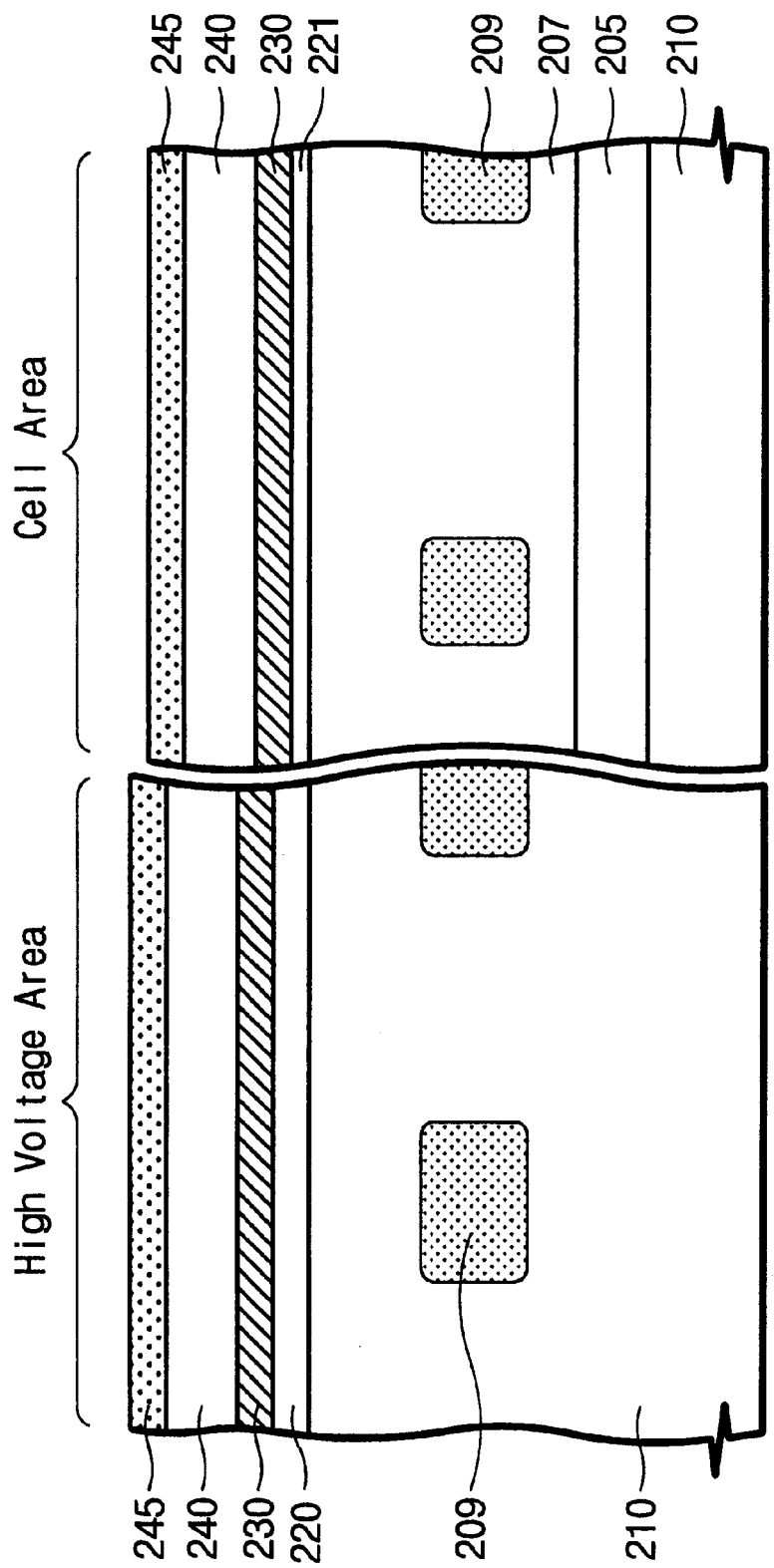
FIG. 5 through FIG. 9 are cross-sectional views of the process flow of the present invention showing the steps of achieving a shallow trench isolation with gate insulating layers of a different thickness in a cell area and a high voltage area of a flash memory, according to the present invention.

Referring to FIG. 5, a buffer layer for ion implantation is formed on a substrate. In a cell area, for example a low-voltage (LV) region of the device, an N-type well 205 and a P-type well 207 are formed on a P-type semiconductor substrate 210 to form a cell transistor in the P-type well 207. In a high voltage (HV) area, these wells 205 and 207 are not formed because a high junction resistor is required to a high voltage. Generally, a photoresist ion implantation mask is used for ion implantation. For a tight device isolation, an ion implantation layer 209 containing boron (B) or phosphorus (P) ions for channel stop is formed prior to formation of a trench. The ion implantation layer 209 overlaps with a trench formation area at about the same, or less, width, for example, within a range of 4200 Å–4800 Å.

After removing the buffer layer, gate insulating layers 220 and 221 having respective different thicknesses are formed as follows. The thick gate insulating layer 220 for the high voltage region is formed on the entire silicon substrate 210 to a thickness of, for example, 100 Å–300 Å. An etching mask pattern is formed to expose a cell area, and, in the exposed cell area, the thick gate insulating layer 220 is removed. With removal of the mask pattern, the thin gate insulating layer for a low voltage is formed to a thickness of 70 Å–100 Å. In the high voltage area, the resulting thickness of the gate insulating layer 220 is 200 Å–400 Å.

An etch protection layer 240 is formed on the gate insulating layers 220 and 221 to a thickness on the order of hundreds of angstroms to 1000 angstroms. In a self-aligned NAND flash memory, a polysilicon layer 230 is formed to a thickness of hundred of angstroms prior to formation of the etch protection layer 240. The polysilicon layer is eventually used to form a floating gate. As a mask layer 245, a silicon oxide layer is deposited over the etch protection layer 240 to a thickness of hundreds of angstroms. If a silicon nitride layer is directly patterned by a photoresist layer, the resulting pattern width would be inconsistent. In this regard, the silicon oxide layer 245 is deposited to promote uniformity in the pattern width. An antireflection film may additionally be stacked thereon to promote consistency.

Figure 6:
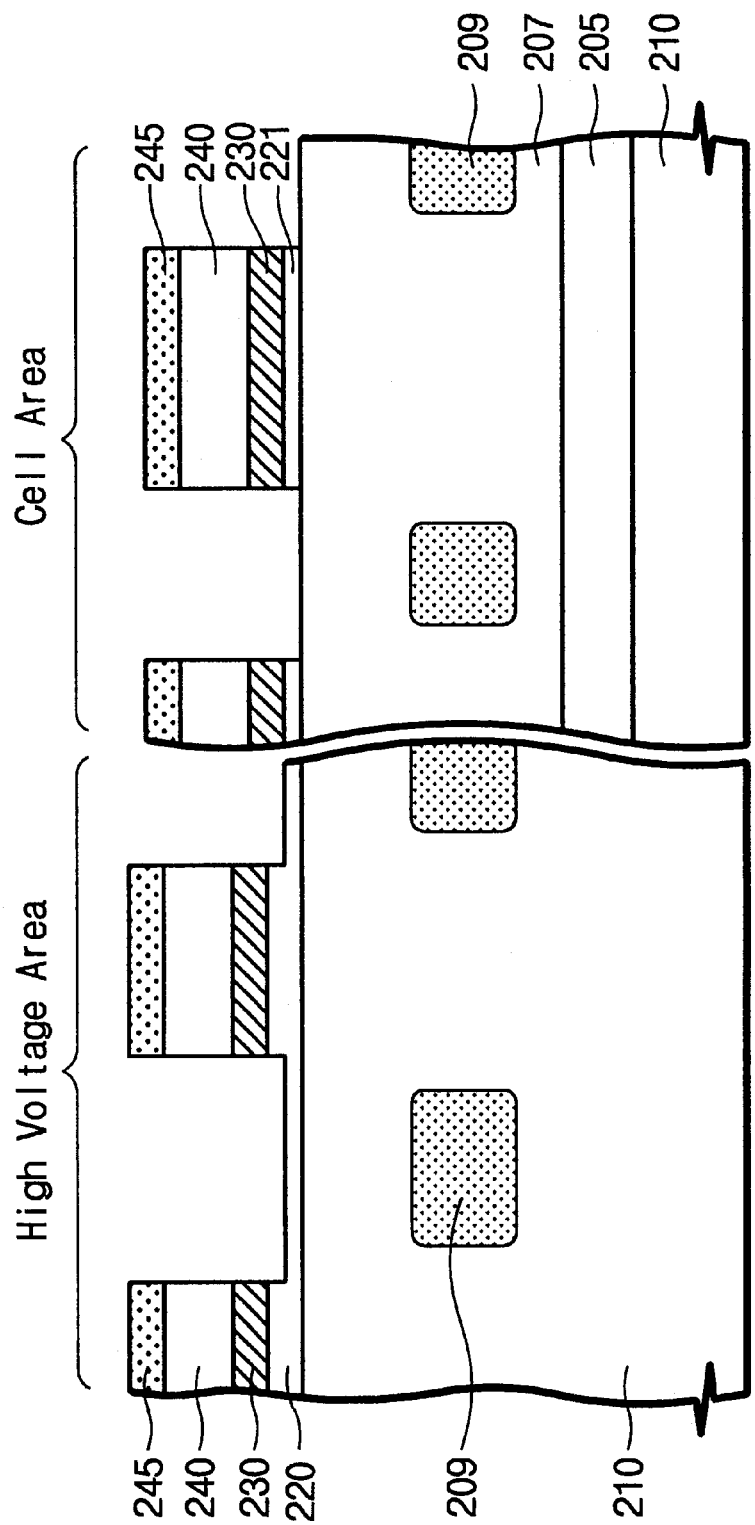

Referring to FIG. 6, using a photoresist pattern (not shown), the hard mask layer 245 is etched to form a mask pattern exposing a trench area. Using the mask pattern, the etch protection layer 240 is etched. Thereafter, the etch protection layer 240 is etched again by means of an etchant to the polysilicon layer 230 and gate insulating layers 220 and 221 until the relatively thinner gate insulating layer 221 in the cell area is completely removed. As a result, the lower portion of the gate insulating layer 220 remains in the high voltage area to a thickness of 100 Å–300 Å.

Figure 7:
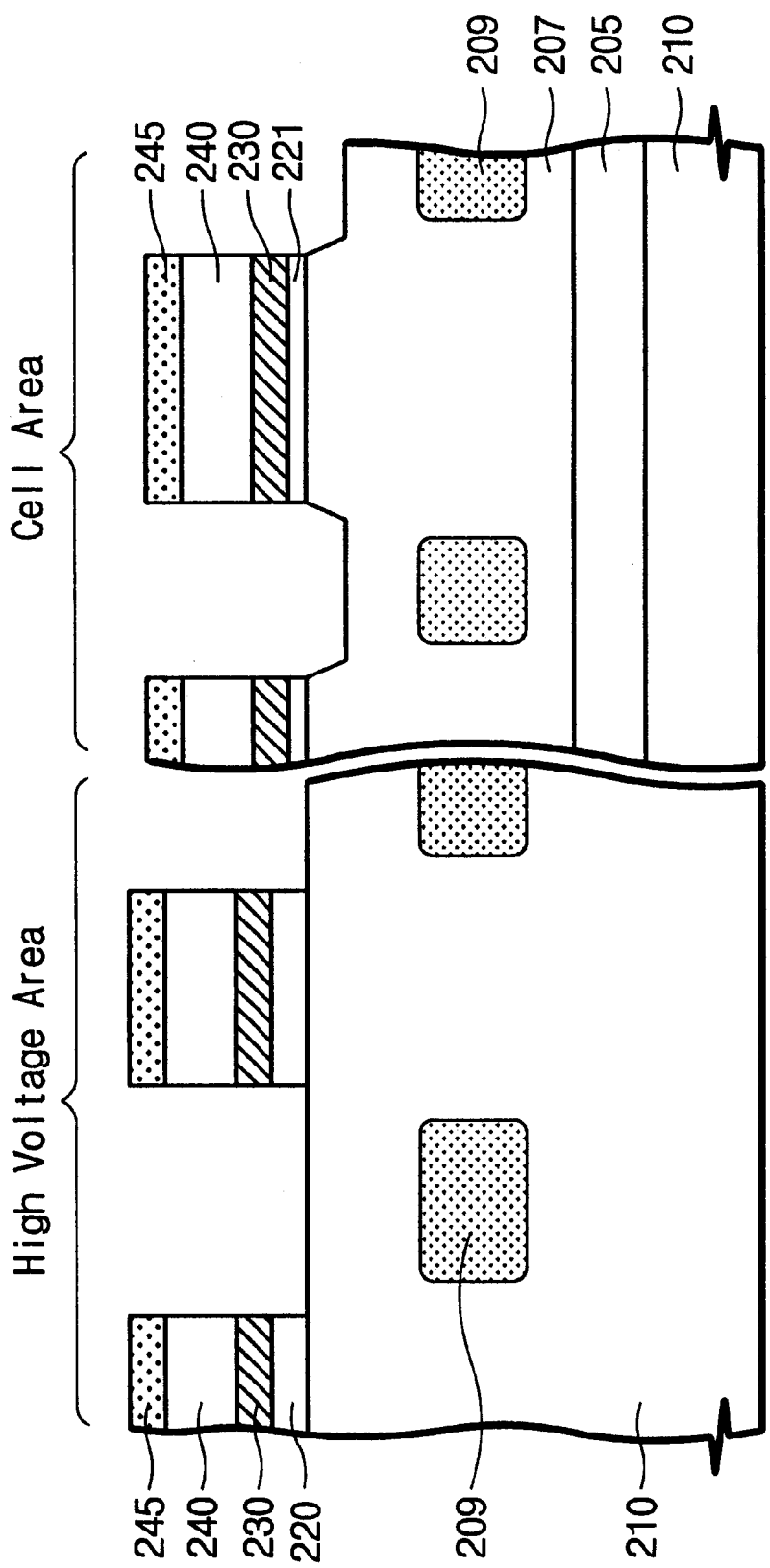

Referring to FIG. 7, the remaining gate insulating layer 220 is removed by means of an etchant wherein an etching selectivity of a silicon substrate to the gate insulating layer is in the range of approximately 1:1 to 3:1. When the substrate 210 in the high voltage area becomes exposed, the P-well 207 in the cell area has become partially etched as shown by means of the etchant. Thus, a trench is formed to a thickness of 100 Å–900 Å.

Figure 8:
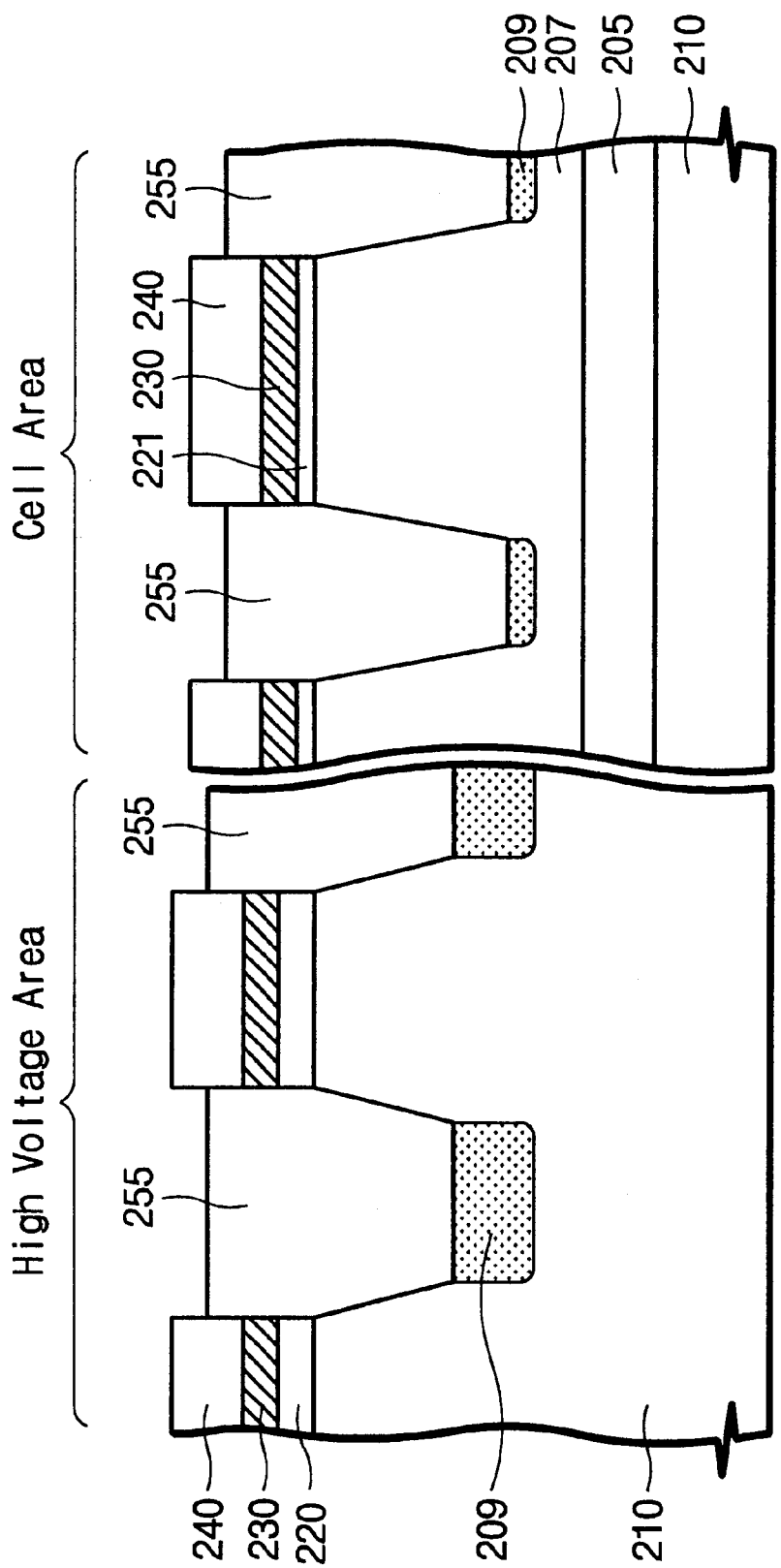

Referring to FIG. 8, the substrate 210 in the cell area and the high voltage area is continuously etched. An etchant capable of etching silicon and silicon oxide may continuously be used. Alternatively, an etchant having a greater etching selectivity with respective to the silicon may be used. A trench depth difference in both areas is maintained, or alternatively may be reduced because an etching rate of the high voltage area is somewhat higher. For example, assume an initial trench depth difference between the high voltage area and the cell area of 600 Å. Since the high voltage area is quickly etched relative to the cell area, a trench having a depth of 4700 Å would be formed in the cell area and a trench having a depth of 4300 Å would be formed in the high voltage area. That is, the depth difference may reduced to be 400 Å.

In the etching step, the hard mask is removed. A silicon oxide layer is deposited by way of CVD. The silicon oxide layer is then planarized by CMP to form a device isolation layer 255.

Figure 9:
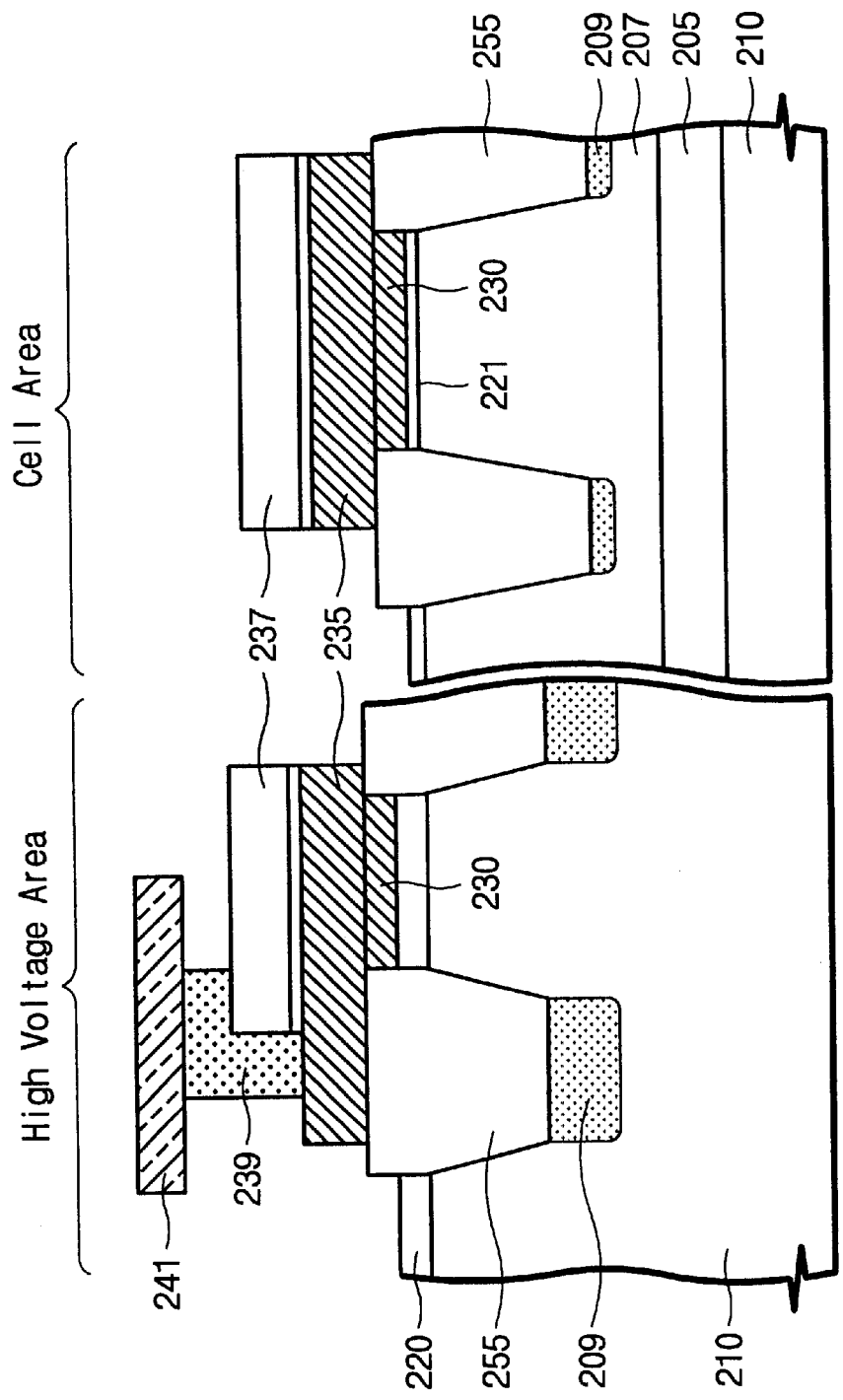

Referring to FIG. 9, a silicon nitride layer, i.e., an etch protection layer 240 is removed by means of a wet etch. A polysilicon upper layer is stacked on the polysilicon layer 230, and is patterned to form a floating gate pattern 235. A dielectric film and a control gate layer 237 are sequentially stacked and patterned to form a wordline. In the high voltage area, a control gate is coupled to a floating gate and a contact plug 239 of a butting contact is formed to couple an upper circuit line 241. In the resulting structure shown in FIG. 9, although the ion implantation layer 209 for the channel stop is smaller than the trench area width, the resistance of the reverse connection resistor is negligibly changed. If the depth of the ion implantation 209 is identical in the cell area and the high voltage area, and lower portion of the trench is positioned within the formation depth of the ion implantation layer 209 (i.e., the practical ion implantation layer 209 remains under the trench lower part to a depth of 0 Å–600 Å), the depth of the trench for device isolation (i.e., the thickness of the device isolation layer 255) is substantially identical in both cell and high-voltage areas.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A shallow trench isolation type semiconductor device comprising:

a gate insulating layer formed in a first region and in a second region, the gate insulating layer being of greater thickness in the first region, relative to the thickness of the gate insulating layer in the second region; and a shallow trench isolation layer formed in the first region and the second region, wherein the shallow trench isolation layer in the first region is thinner than shallow trench isolation layer in the second region.

2. The semiconductor device of claim 1, wherein the shallow trench isolation area in the first region is thinner than that in the second region by 100 Å–900 Å.

3. The semiconductor device of claim 1, wherein an ion implantation layer for channel stop is formed to overlap with a lower part of the shallow trench isolation layer, and a depth of the ion implantation layer is identical in both the first region and the second region.

4. The semiconductor device of claim 3, wherein the ion implantation layer is a P-type impurity implantation layer.

5. The semiconductor device of claim 1, wherein the gate insulating layer in the first region has a thickness of 200 Å–400 Å, and the gate insulating layer in the second region has a thickness of 70 Å–100 Å.

6. A shallow trench isolation type semiconductor device comprising:

gate insulating layers formed in a cell area and a high voltage area, the gate insulating layers being different in thickness in the cell area and high voltage area;

a shallow trench isolation layer formed in the cell area and the high voltage area, wherein the shallow trench isolation layer in the high voltage area is thinner than that of the cell area by 100 Å–900 Å; and an ion implantation layer for channel stop overlapping with a lower part of the shallow trench isolation layer, wherein the combined depth of the ion implantation layer and the shallow trench isolation layer is equal in the cell area and the high voltage area.

* * * * *